United States Patent
Johnson

(10) Patent No.: US 8,437,481 B2
(45) Date of Patent: May 7, 2013

(54) ADAPTER FOR CONNECTING ACCESSORIES TO AN ELECTRONIC DEVICE

(75) Inventor: Timothy Johnson, San Jose, CA (US)

(73) Assignee: Apple Inc., Cupertino, CA (US)

( * ) Notice: Subject to any disclaimer, the term of this patent is extended or adjusted under 35 U.S.C. 154(b) by 836 days.

(21) Appl. No.: 12/276,226

(22) Filed: Nov. 21, 2008

(65) Prior Publication Data

US 2010/0128900 A1    May 27, 2010

(51) Int. Cl.
*H03G 5/00* (2006.01)

(52) U.S. Cl.
USPC .............. 381/98; 381/320; 439/52; 703/25

(58) Field of Classification Search ............. 381/68.2, 381/98, 320, FOR. 129
See application file for complete search history.

(56) References Cited

U.S. PATENT DOCUMENTS

| | | | |
|---|---|---|---|
| 2003/0138080 A1* | 7/2003 | Nelson et al. | 379/88.16 |
| 2005/0014119 A1* | 1/2005 | Rudakov | 434/350 |
| 2009/0179768 A1* | 7/2009 | Sander et al. | 340/825.73 |

* cited by examiner

*Primary Examiner* — Thanh V Pham
(74) *Attorney, Agent, or Firm* — Womble Carlyle Sandridge & Rice LLP

(57) ABSTRACT

Users with headsets may share an electronic device such as a portable computer or handheld device. The electronic device may have a connector such as an audio jack for receiving mating audio plugs on headsets. During normal operation with a single user, audio signals may be conveyed through the audio jack to the headset of the single user. When more than one user wishes to share the electronic device, an adapter accessory may be inserted into the audio jack of the electronic device. The headset of each user may be plugged into mating audio jacks in the adapter accessory. Circuitry in the adapter accessory may receive and process user input from each of the users. User input may be used to make local audio adjustments in the adapter accessory. User input may also be provided from the adapter accessory to the electronic device for processing.

22 Claims, 13 Drawing Sheets

| COMMAND | USER A | USER B | RECEIVED AT DEVICE |
|---|---|---|---|
| VOLUME UP | USER A LOCAL VOLUME UP | USER B LOCAL VOLUME UP | NOTHING |
| VOLUME DOWN | USER A LOCAL VOLUME DOWN | USER B LOCAL VOLUME DOWN | NOTHING |
| CLICK | PLAY/ PAUSE | PLAY/ PAUSE | PLAY/ PAUSE |
| DOUBLE CLICK | NEXT ITEM | NEXT ITEM | NEXT ITEM |
| TRIPLE CLICK | PREVIOUS ITEM | PREVIOUS ITEM | PREVIOUS ITEM |
| CLICK AND HOLD | TALK | TALK | TALK, MIX LINE IN |

FIG. 3

ADAPTER FOR CONNECTING ACCESSORIES TO AN ELECTRONIC DEVICE

BACKGROUND

This invention relates generally to electronic devices, and more particularly, to adapters that allow multiple users to share an electronic device.

Electronic devices such as computers, cellular telephones, and media players have audio capabilities. In making use of these audio capabilities, users often attach accessories such as headsets to a device. A typical device may include an audio jack or other port for an accessory. The user may insert a mating accessory plug into the port on the device to connect the accessory to the device. Once connected in this way, the user may listen to audio content with speakers in the accessory. If the accessory contains a microphone, the user may speak into the microphone. Microphone signals may then be conveyed to the electronic device from the accessory. Arrangements such as this are often used to support voice telephone calls. A user can listen to audio through headset speakers while conversing with a remote caller using a headset microphone.

Accessories such as headsets contain wires. A user who is using a headset may desire to control an electronic device remotely over the wires. Accordingly, some headsets are provided with buttons. A user may press a headset button to control the electronic device. For example, a user may press a button to answer an incoming telephone call or to play or pause a song during media playback operations.

It is sometimes desirable to share electronic devices between multiple users. For example, if two passengers on an airplane are sitting next to each other, they may wish to view the same movie on a laptop computer. Conventional audio splitters allow multiple headphones to be connected to a common audio jack. Conventional arrangements such as these may therefore be used to allow multiple users to share an electronic device. However, electronic device audio ports typically are driven by audio amplifiers that are coupled to audio jacks through direct current (DC) blocking capacitors. The size of these DC blocking capacitors is chosen to provide an optimal frequency response when transmitting audio signals to a single headset. When multiple headsets are connected to a device using a conventional splitter, the reduced impedance resulting from the additional headsets can adversely affect the frequency response of the audio output. Conventional audio splitters are also incapable of handling more advanced functions such as functions responsive to user input commands.

It would therefore be desirable to be able to provide improved ways in which multiple users can share an electronic device.

SUMMARY

An electronic device such as a portable computer, cellular telephone, or media player may have audio amplifier circuitry. An audio connector such as an audio jack in the electronic device may receive a mating plug associated with an accessory such as a headset.

During use by a single user, the audio amplifier circuitry in the electronic device may provide audio output signals to the headset through the audio jack. When it is desired to share the electronic device between multiple users, an adapter accessory may be connected to the electronic device. The adapter accessory may have two or more audio jacks into which audio plugs from two or more accessories may be connected. For example, two users may each plug a headset plug into a respective one of the audio jacks in the adapter accessory. The adapter accessory may also have a connector with which the adapter accessory is electrically connected to the electronic device. The connector that is used to connect the adapter accessory to the electronic device may be an audio connector such as an audio plug, may be a data port connector such as a 30-pin connector, or may be any other suitable electrical connector.

The headsets or other accessories may include user input interfaces that receive user input from users. The user input interfaces may, for example, include resistively encoded buttons. When a user presses a given button or otherwise supplies user input, the user input may be conveyed from that user's accessory to the adapter accessory. The adapter accessory may include circuits for receiving and processing user input from each of its connected headsets or other accessories. The adapter accessory may also include audio circuitry. The audio circuitry in the adapter accessory may be adjusted to individually control the audio signals that are being provided to each user. The circuitry in the adapter accessory may also include communications circuitry for communicating with the electronic device.

The adapter accessory may communicate with attached accessories using any suitable technique. The adapter accessory may, for example, communicate by using analog tones or other analog signals to convey data or by using digital signaling techniques. Analog and digital communications may be implemented using any suitable communications protocol and may be unidirectional or bidirectional. Relatively low data rates and/or high-speed communications may be supported. With one suitable arrangement, user input from accessories may be conveyed to the adapter accessory in the form of ultrasonic tones. The adapter accessory may also use techniques such as these in communicating with the electronic device.

During operation, the adapter accessory can receive ultrasonic tones or information in other suitable formats from attached accessories and can take appropriate actions. For example, if the user input from a user specifies that the audio volume for that user should be adjusted, the adapter accessory may adjust its audio circuitry to independently adjust the volume for the appropriate user without changing the volume for other users. In some situations, user input commands may be forwarded to the electronic device for processing. For example, if a user supplies user input that requests that the playback of a movie by paused, the pause request may be forwarded from the adapter accessory to the electronic device. The electronic device may then respond by pausing media playback or taking other suitable actions.

In configurations in which the connector between the electronic device and adapter accessory is an audio jack, it may be advantageous to communicate between the adapter accessory and the electronic device using ultrasonic tones. Ultrasonic tone communications may be supported using tone generators and tone detectors that are connected to suitable electrical lines in the paths connecting the accessories to the adapter accessory and suitable electrical lines in the paths connecting the adapter accessory to the electrical device. For example, ultrasonic tone communications may be supported using microphone lines.

When the connector between the electronic device and the adapter accessory is a data port connector, universal asynchronous receiver-transmitter circuits or other digital data communications circuits may be used to support communications. Digital data communications techniques based on universal asynchronous receiver-transmitter circuits and other such communications techniques may also be used in supporting communications between the adapter accessory and headsets or other accessories. The accessories may be provided with universal asynchronous receiver transmitter circuits or other digital data communications circuits to support digital data communications with associated digital data communications circuits in the adapter accessory.

Accessories such as headsets may include microphones. Circuitry in the adapter accessory may provide microphone bias signals to the microphones in the headsets that allow the microphones to function properly. When multiple users are connected to an electronic device through an adapter accessory, microphone signals may be gathered from each user as they speak. The microphone signals may be mixed using summing circuitry in the adapter accessory. The combined microphone signal may then be provided to the electronic device. The electronic device may broadcast the microphone signal to all connected users. This allows the users to converse with each other. For example, users may talk to each other about a movie as the electronic device is playing the movie for the users. In configurations in which the adapter accessory is connected to the electronic device using a data port with multiple line-in paths, the microphone signals from first and second users may be routed to respective first and second line-in paths (e.g., the right and left line-in paths in the data port). The device may combine these microphone signals and may broadcast the combined signals to allow the users to communicate with each other.

Adapter accessories may be provided with battery power or may tap into power lines in the electronic device. The audio connectors that are used in connecting accessories to the adapter accessory and that may be used in connecting the adapter accessory to the electronic device may be four-contact audio plugs and jacks or other suitable audio connectors.

Further features of the invention, its nature and various advantages will be more apparent from the accompanying drawings and the following detailed description of the preferred embodiments.

BRIEF DESCRIPTION OF THE DRAWINGS

FIG. 3 is a table showing how user-generated commands may be processed in accordance with an embodiment of the present invention.

DETAILED DESCRIPTION

The present invention relates generally to electronic devices, and more particularly, to ways in which multiple users can share an electronic device. Each user may, for example, have an accessory such as a headset. An adapter accessory may be provided that plugs into an electronic device. The adapter accessory may have multiple ports with which accessories such as headsets may be connected. This type of arrangement allows multiple users to each connect a respective accessory to the adapter. The adapter is connected to the shared electronic device, so each user has access to device functions. For example, each user may receive and listen to audio that is provided by the electronic device. Each user may also make independent adjustments using their associated accessory. For example, each user may make audio playback adjustments. If desired, the users that are connected to the adapter accessory and electronic device may communicate using their accessories. Each user may, as an example, speak into a microphone. Audio signals corresponding to the user's speech may be distributed to the users. Users who are sharing an electronic device to watch a movie or other media can therefore talk to each other about the content that is being presented during playback.

The electronic devices that can be shared using the adapter accessory may be, for example, handheld devices such as cellular telephones, media players, handheld computers (also sometimes called personal digital assistants), remote controllers, global positioning system (GPS) devices, and handheld gaming devices. The electronic devices may also be desktop or portable computers, media equipment, pendent devices, wristwatch devices, or other wearable equipment, or other suitable electronic equipment. If desired, the electronic devices may be hybrid devices that combine the functionality of multiple conventional devices. Examples of hybrid portable electronic devices include a cellular telephone that includes media player functionality, a gaming device that includes a wireless communications capability, a cellular telephone that includes game and email functions, and a portable device that receives email, supports mobile telephone calls, has music player functionality and supports web browsing. These are merely illustrative examples. An adapter accessory can, in general, be used with any suitable electronic device.

Figure 1:
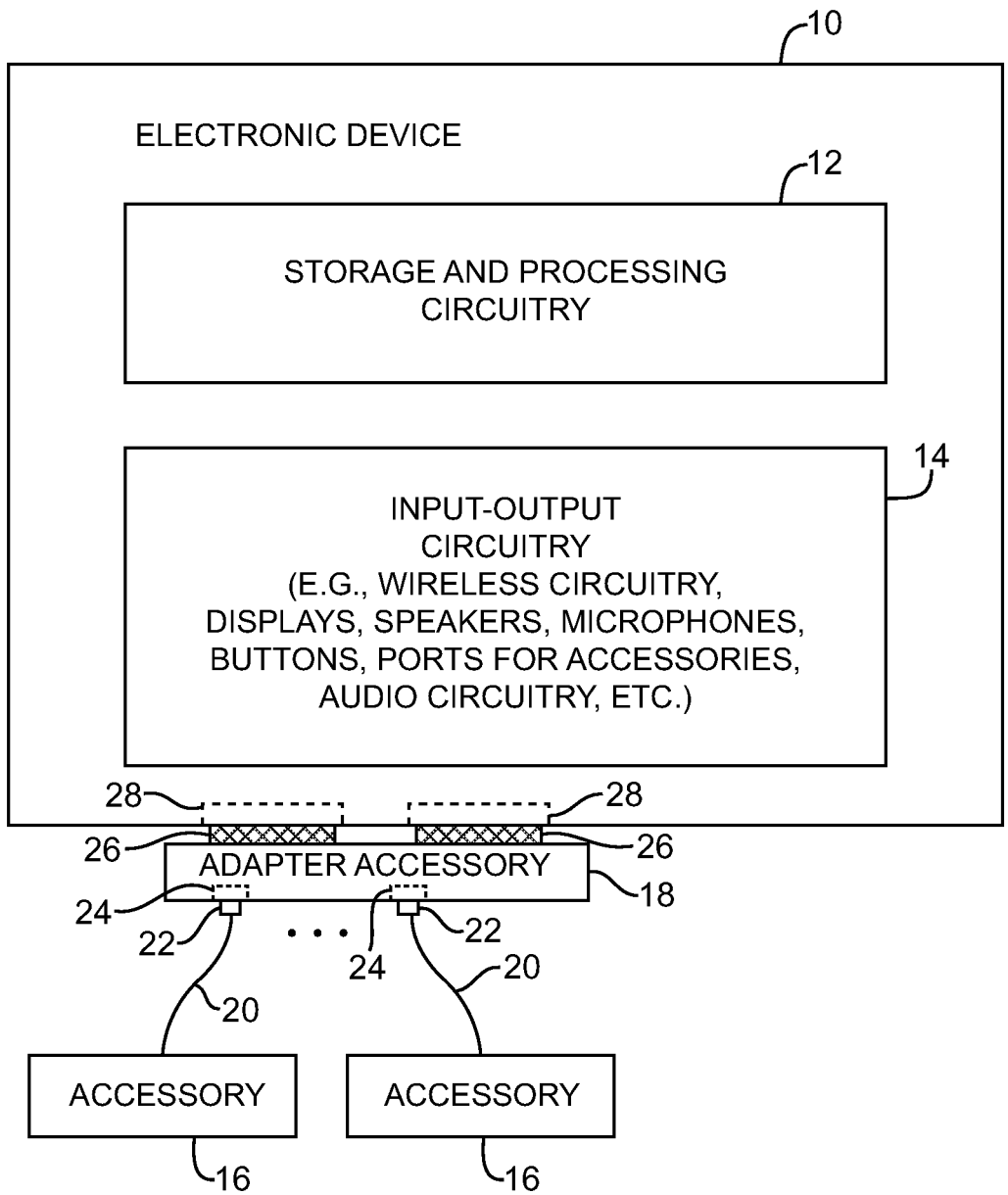
FIG. 1 is a diagram of illustrative circuitry that may be used in an electronic device in accordance with an embodiment of the present invention.

An illustrative electronic device in accordance with an embodiment of the present invention is shown in FIG. 1. Device 10 of FIG. 1 may be, for example, a handheld electronic device such as a cellular telephone or media player or may be a laptop computer.

Device 10 may have storage and processing circuitry 12 that is used in controlling the operation of device 10. Circuitry 12 may include one or more different types of storage such as hard disk drive storage, nonvolatile memory (e.g., flash memory or other electrically-programmable-read-only memory), volatile memory (e.g., static or dynamic random-access-memory), etc. Processing circuitry in circuitry 12 may be based on one or more processors such as microprocessors and other suitable integrated circuits.

Storage and processing circuitry 12 may be used to run software on device 10 such as applications and operating system components. This software may be used in controlling the operation of device functions. For example, software may be used in implementing communications protocols, in providing a user interface for controlling media playback operations, etc.

Device 10 may have input-output circuitry 14. Input-output circuitry 14 may be used to allow data to be supplied to device 10 and may be used to allow data to be provided from device 10 to external devices. Input-output circuitry 14 may include wireless communications circuitry such as communications circuitry to support local area network wireless links and long-range wireless links such as cellular telephone links. Input-output circuitry 14 may also include one or more displays. For example, input-output circuitry 14 may include a display such as a liquid crystal display (LCD), an organic light-emitting diode (OLED) display, a plasma display, an electronic ink display, or other suitable components that present visual information to a user. If desired, touch screen functionality may be integrated into a display. Input-output circuitry 14 may include input control devices such as buttons and other switches and input-output ports for microphones and speakers. Input-output circuitry 14 may also include controls such as touch pads, pointing sticks, joysticks, click wheels, scrolling wheels, key pads, keyboards, cameras, or other suitable interfaces for controlling device 10.

As illustrated by connectors 28 in FIG. 1, input-output circuitry 14 may have associated input-output connectors such as data port connectors and jacks. Connectors 28 may include universal serial bus port connectors, 30-pin data connectors, and other data connectors that can handle analog signals and digital data signals. Audio devices such as headsets are typically connected to electronic equipment using audio plugs. Connectors 28 may therefore also include audio connectors such as audio jacks. The audio jacks may be, for example, four-contact jacks (female connectors) that receive mating four-contact plugs (male connectors) associated with external components. Audio jacks may be used to handle analog signals such as analog microphone and speaker signals and digital signals. The signals that are conveyed through connectors 28 may be used to convey status information, control information, media content, etc.

Multiple users may share device 10. Each user may have an associated accessory 16. Accessories 16 may have communications paths 20. Paths 20 may, for example, be wired cables such as the cables associated with headsets. Each path 20 may have an associated terminating connector 22 such as an audio plug. Audio plugs 22 may be plugged into corresponding audio jacks 24 in adapter accessory 18. Adapter accessory 18 may, in turn, be connected to electronic device 10. As shown in FIG. 1, adapter accessory 18 may be connected to electronic device 10 using one or more connectors 26 that plug into mating connectors 28 in device 10.

Using adapter accessory 18, multiple users may share device 10, even if there would not otherwise be a sufficient number of ports available on device 10 to independently accommodate each of the multiple users. For example, device 10 may have a single audio jack. Two users may wish to share the single audio jack so that they can watch a movie together. Using adapter 18, each user may plug a headset audio plug into adapter accessory 18. Adapter accessory 18 may then be plugged into the single audio jack that is available in device 10. During operation, audio signals may be provided from device 10 to both users through adapter accessory 18. Adapter accessory 18 may also be used to process user commands. For example, if each user has a headset with buttons, each user may wish to independently control the volume of the audio that is playing back through that user's headset. Adapter accessory 18 may receive volume change commands from each user and may take appropriate action. For example, adapter accessory 18 may make local adjustments to audio amplifier circuitry in adapter accessory 18 to increase or decrease one user's volume setting without affecting the volume setting of the other user. As another example, adapter accessory 18 may relay commands to electronic device 10, so that electronic device 10 can take appropriate action. In response to a "stop" command from one of the users, for example, device 10 may stop media playback operations for both users.

Figure 2:
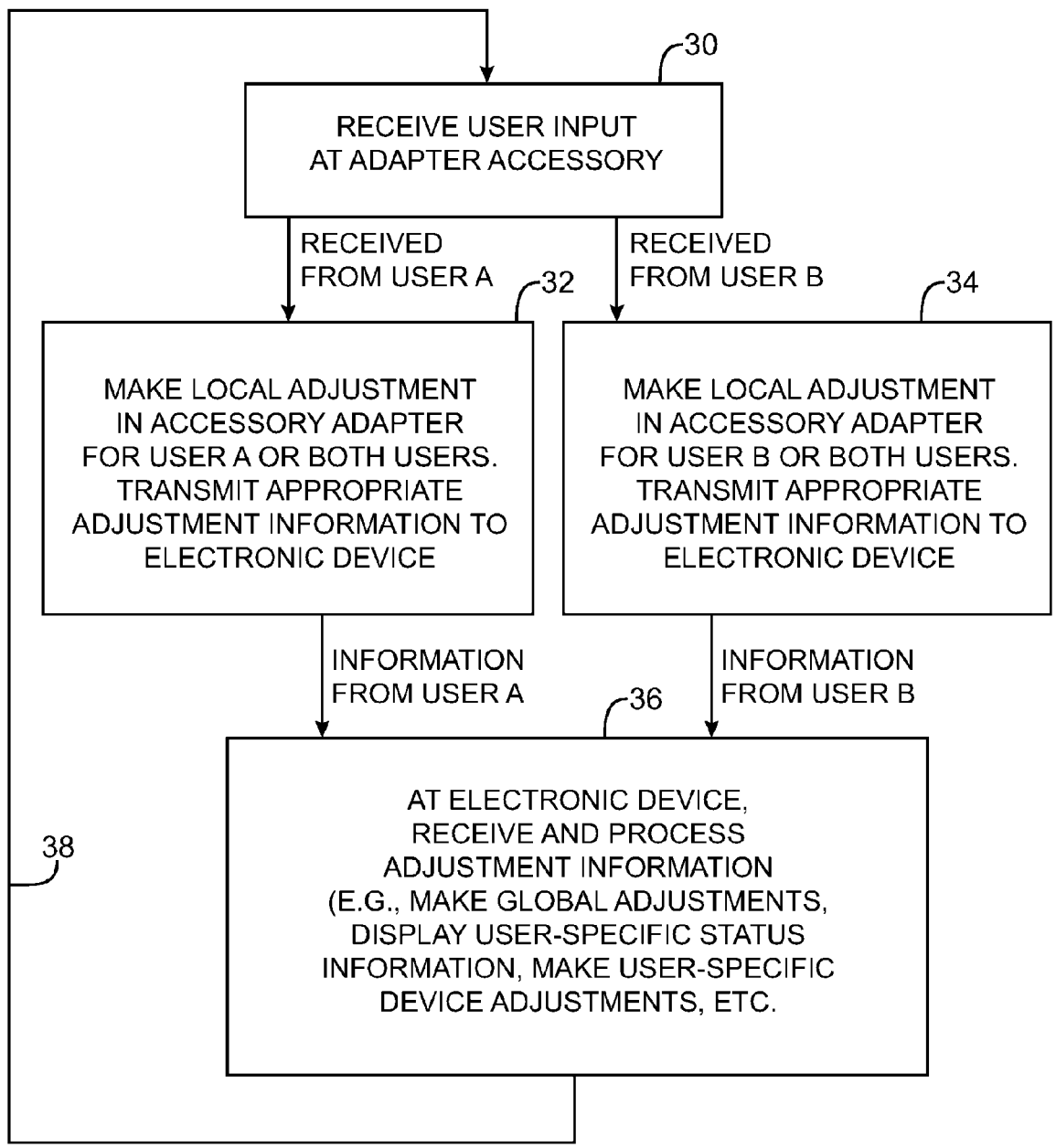
FIG. 2 is a flow chart of illustrative steps involved in sharing an electronic device between multiple users each of which has a corresponding accessory in accordance with an embodiment of the present invention.

A flow chart of illustrative steps involved in using an adapter accessory such as adapter accessory 18 of FIG. 1 in a scenario in which two users (users A and B) with respective accessories 16 are sharing a single electronic device such as device 10 of FIG. 1 is shown in FIG. 2. In general, any suitable number of users may share a given device (e.g., two, three, more than three, etc.), provided that adapter accessory 18 has a sufficient number of available accessory ports. An illustrative arrangement in which two accessories 16 are plugged into two corresponding ports of adapter accessory 18 to allow two users to share device 10 is described herein as an example.

Each accessory 16 can have a user input interface. The user input interface may, for example, include one or more buttons that may be selected by a user. If desired, different button commands can be used to control different device functions. For example, each button may have a different associated function (play, rewind, forward, etc.). As another example, a single click of a given button may have a different associated function than a double click. Click-and-hold and triple click commands may be used. Combinations of these arrangements and other suitable arrangements may also be used in making button commands.

As each user supplies user input, adapter accessory 18 and device 10 may respond appropriately. For example, adapter accessory 18 may intercept commands and respond locally, without requiring action on the part of device 10. Adapter accessory 18 may also convey some or all of the user input that is received from accessories 16 to device 10 so that device 10 can respond to the user input. These types of behavior are illustrated in the example of FIG. 2.

As shown by step 30, for example, adapter accessory 18 may receive user input from an accessory 16 during operation of device 10. The accessory may be associated with user A or with user B (in the FIG. 2 example). If the user input is received from user A, processing continues at step 32. If the user input is received from user B, processing continues at step 34.

During steps 32 and 34, the user input may be processed locally by adapter accessory 18. For example, if a given user desires to make an adjustment that exclusively or primarily affects only that user, adapter accessory 18 may process the user's input locally. An example of a command that may at least sometimes be processed locally is a volume adjustment command. Each user may have a different type of accessory or may have a personal preference regarding how loudly media is played back. Accordingly, a user who requires a louder media playback experience may supply adapter accessory 18 with user input indicating a desire for a volume increase. Adapter accessory 18 may respond to this type of request by making a local volume adjustment for the requesting user, while leaving the volume for the other user unchanged.

Some received user input commands may relate to settings that should be handled by device 10. For example, global functions such as video playback operations may be handled globally in device 10. When this type of command is received from a user at adapter accessory 18, adapter accessory 18 may retransmit the command or otherwise provide the command to device 10 for processing. Global commands that may be processed by device 10 may include commands that affect both users such as video control commands, screen brightness adjustment commands, certain types of volume adjustment commands, equalization setting commands or other commands that require circuitry that is only available in device 10, etc. During steps 32 and 34, adapter accessory 18 may retransmit the same user input that was received from user A or user B to device 10 or may transmit other appropriate information to device 10 such as a processed version of the user input.

At step 36, device 10 may receive the transmitted information from adapter accessory 18. The received information may correspond to an operating command such as a command for controlling a media playback operation. The command may be processed in device 10. The command may direct device 10 to take a global action that affects both users of device 10 or may direct device 10 to take an action that exclusively or primarily affects one of the users. Commands may be processed that direct device 10 to increase or decrease media playback volumes, to move forward or back in a media file, to start or stop media playback, to navigate through menu items, to control voice calls or other telephone functions, etc.

In some usage scenarios, there may be an interplay between the adjustments made in adapter accessory 18 and device 10. For example, audio volume adjustments may, in general, be made in adapter accessory 18, in device 10, or in both adapter accessory 18 and device 10. During steps 32, 34, and 36, adapter accessory 18 and device 10 may make adjustments in a way that optimizes overall performance. For example, volume adjustments may be made using both accessory 18 and device 10 so as to avoid distortion and noise effects that might arise if volume adjustments were exclusively made using adapter accessory 18 or were made exclusively made using device 10.

As indicated by line 38, processing may loop back to step 30, so that additional commands may be provided from each user with the user input interface in that user's accessory 16.

FIG. 3 shows a table of illustrative commands that users may supply using accessories 16. Each accessory may have a user input interface such as a set of several buttons. The buttons may include, for example, a "+" button that is used for commands such as volume increase commands, a "−" button that is used for commands such as volume decrease commands, and a "play-pause" button that is used to initiate playback or to stop playback of media. As shown in the first two rows of the table of FIG. 3, when a user makes a volume up or volume down command, adapter accessory 18 may receive the command and respond by making appropriate volume adjustments without sending any information to device 10. Audio amplifier circuits may be provided in adapter accessory 18.

There may be for example, one audio amplifier circuit for handling audio for a first accessory 16 and another audio amplifier circuit for handling audio for a second accessory 16. The audio settings of these audio amplifier circuits can be adjusted independently to accommodate the volume adjustment requests of each user. For example, if user A produces a volume up command, the audio amplifier circuit for user A in adapter accessory 18 may be adjusted accordingly, without making any adjustments to the volume produced by the audio amplifier circuit for user B.

As shown in the third, fourth, fifth, and sixth rows of the table of FIG. 3, in some situations it may be desirable for adapter accessory 18 to transmit user input information to device 10. As an example, consider the situation in which user B enters a "click" command using the play-pause button (corresponding to the third row of the FIG. 3 table). In this situation, adapter accessory 18 may intercept user B's command and may transmit the command to device 10. Device 10 can then pause media playback accordingly.

Any suitable communications format may be used to convey user input from accessories 16 to adapter accessory 18. Similarly, any suitable communications format may be used to convey information between adapter accessory 18 and device 10. With one illustrative configuration, accessories 16 may be provided with a transmitter such as an ultrasonic tone generator that transmits user input data to adapter accessory 18 over microphone lines in paths 20. Adapter accessory 18 may communicate with device 10 in a similar fashion (using ultrasonic tones) or may use other suitable serial or parallel digital communications links. As an example, adapter accessory 18 and device 10 may communicate using a universal asynchronous receiver-transmitter (UART) link. Communications between device 10 and adapter accessory 18 and communications between adapter accessory 18 and accessories 16 may be unidirectional or bidirectional.

Figure 4:
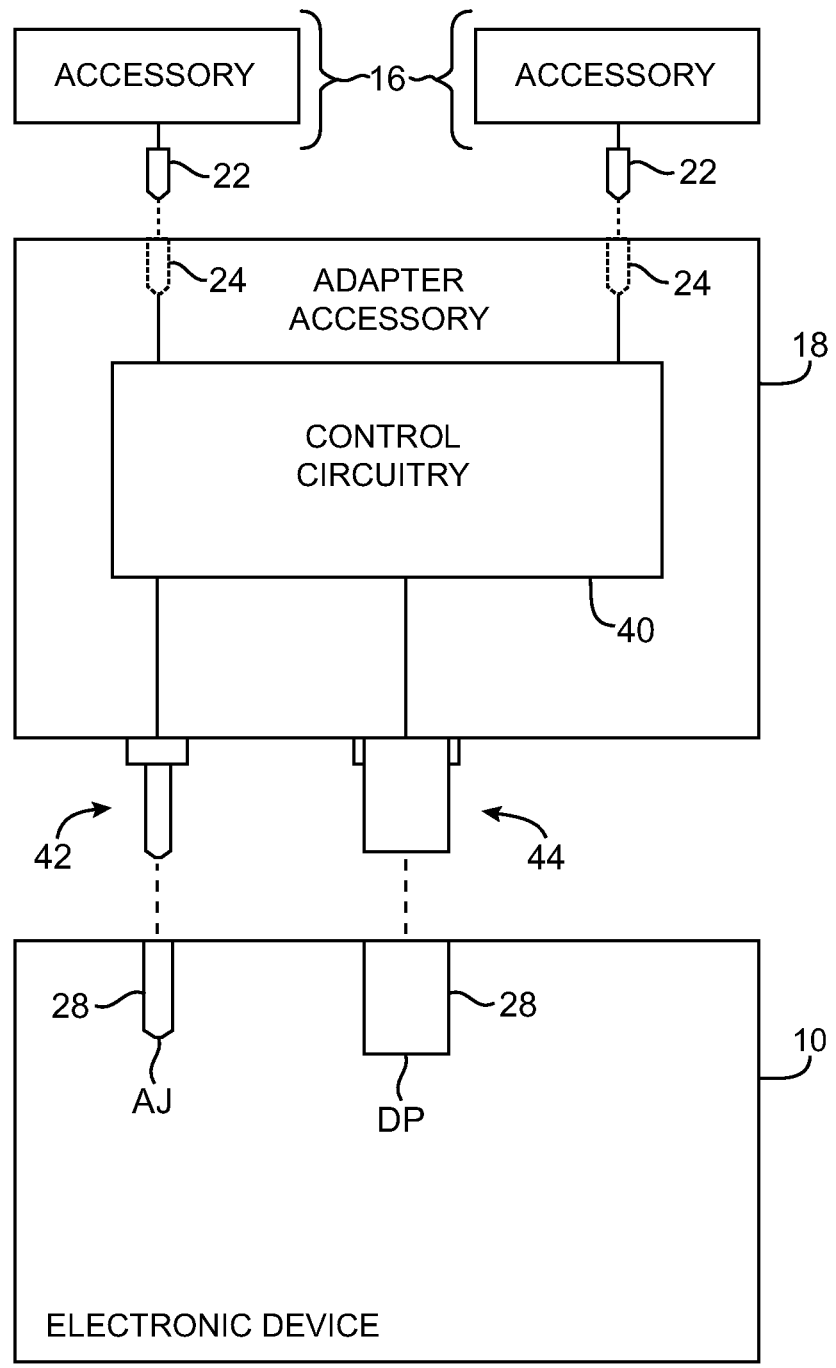
FIG. 4 is a diagram of an illustrative system in which users with accessories can share an electronic device using an adapter accessory with an audio jack and an ancillary connector that taps into a source of power in accordance with an embodiment of the present invention.

An illustrative adapter arrangement is shown in FIG. 4. In the example of FIG. 4, adapter accessory 18 has two audio jacks 24. Audio jacks 24 may receive corresponding plugs 22 associated with respective accessories 16. Control circuitry 40 may include circuitry for providing audio signals to speakers in accessories 16. Control circuitry 40 may also include circuitry for receiving and processing microphone signals and user input commands (e.g., button commands) from accessories 16. Communications circuitry in control circuitry 40 may be used in communicating with device 10.

Electronic device 10 may have connectors 28 such as audio jack AJ and digital data port DP. Jack AJ may be, for example, a four-contact audio jack. Port DP may be, for example, a universal serial bus (USB) port. Jack AJ may receive audio plug 42 of adapter accessory 18. Data port DP may receive plug 44 of adapter accessory 18 (e.g., a USB plug). When adapter accessory 18 is connected to device 10, audio jack AJ may be used to convey audio signals and data between device 10 and adapter accessory 18. The connection made using data port DP may be used to convey power to control circuitry 40 of adapter accessory 18. The data port connection between adapter accessory 18 and device 10 may also be used to convey audio and data signals. By tapping into data port DP for power, the need for a battery to power control circuitry 40 and accessories 16 can be eliminated.

Figure 5:
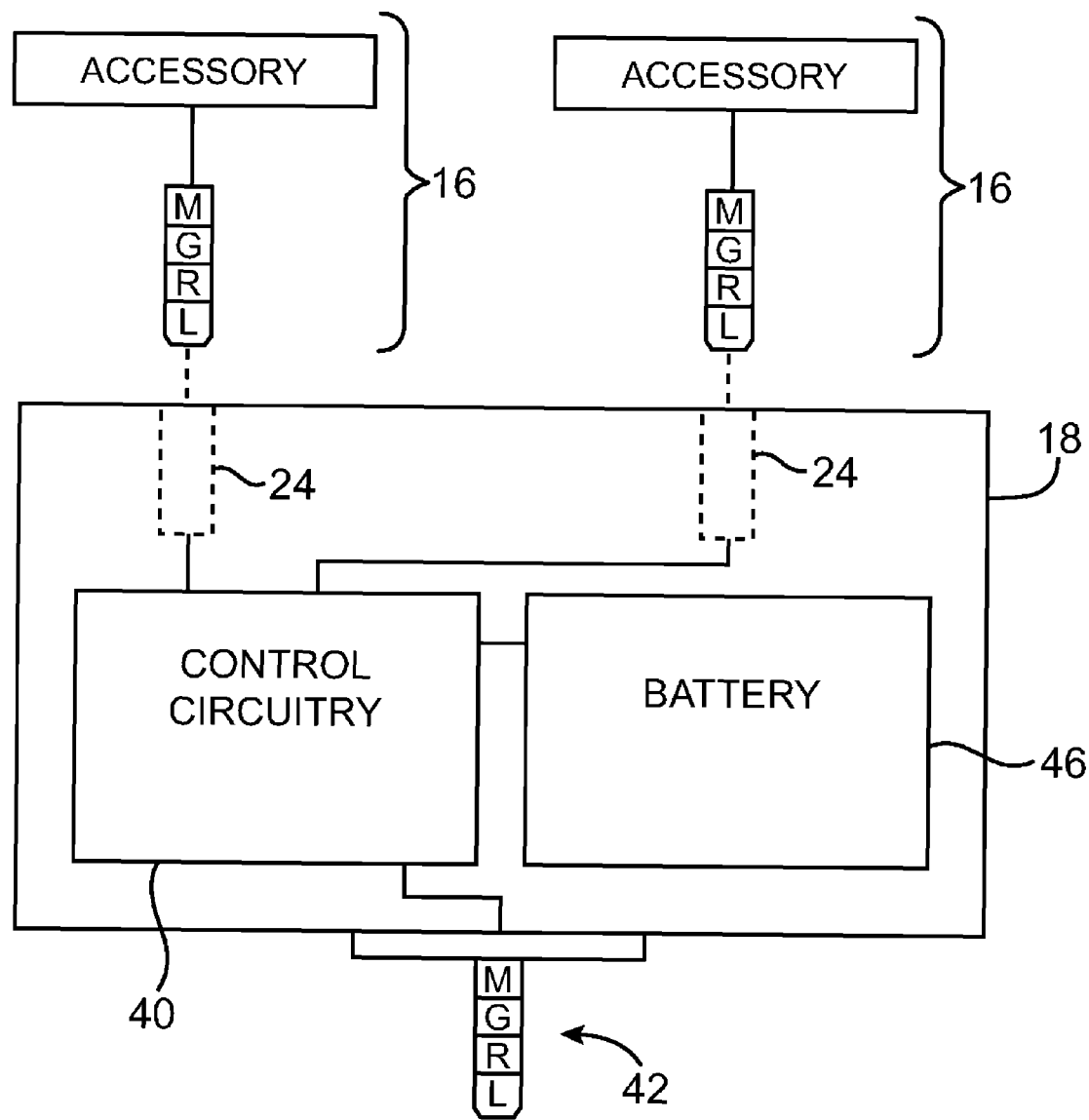
FIG. 5 is a diagram of an illustrative system in which users with accessories can share an electronic device using an adapter accessory with an audio jack and a source of power such as a battery in accordance with an embodiment of the present invention.

Another illustrative adapter arrangement is shown in FIG. 5. In the example of FIG. 5, a battery such as battery 46 is being used to power adapter accessory 18. In this type of arrangement, it is not necessary to tap into a data port or other source of power in device 10. FIG. 5 also shows how audio plug 42 may include four contacts such as a microphone contact M, a ground contact G, and right and left audio contacts (R and L). The number and type of contacts used in audio plug 42 of FIG. 5 is merely illustrative. Audio plugs for adapter accessory 18 and accessories 16 may have any suitable number of contacts and any suitable signal assignment scheme may be used if desired.

Figure 6:
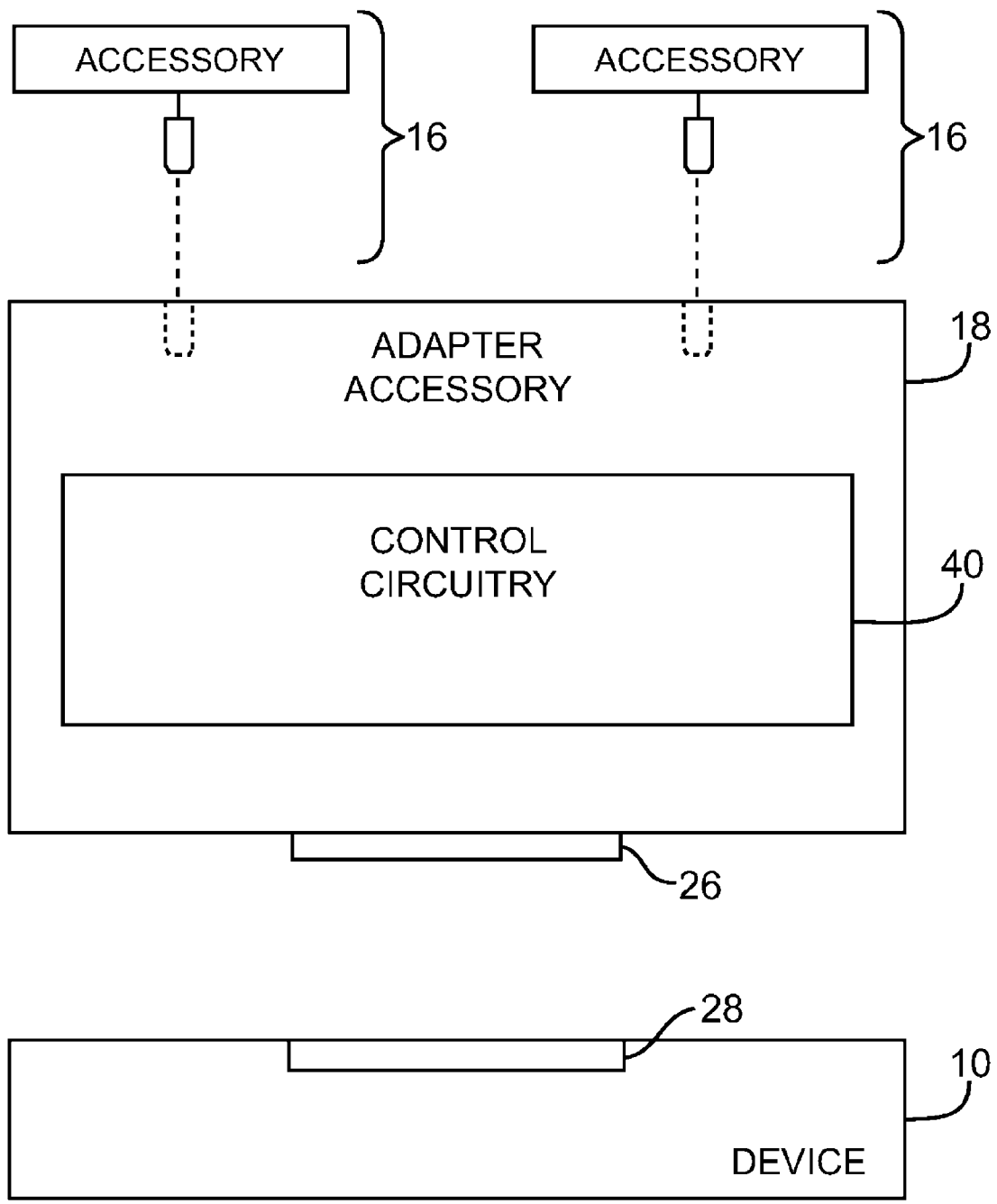
FIG. 6 is a diagram of an illustrative system in which users with accessories can share an electronic device using an adapter accessory with a data port connector in accordance with an embodiment of the present invention.

In the illustrative adapter arrangement of FIG. 6, adapter accessory 18 has a connector such as a data port connector. Data port connector 26 may be, for example, a 30-pin connector. Data port connector 26 may plug into a mating 30-pin connector in device 10 such as connector 28. Connector 26 may be a male connector and connector 28 may be a female connector (as an example). Connectors 26 and 28 may include pins for carrying audio signals such as right and left line in and line out paths. The line in paths may be used to handle respective microphone signals from first and second accessories 16. The line out paths may be used to supply audio output signals to accessories 16. Connectors 26 and 28 may also include other paths such as power paths for providing power to accessories such as adapter accessory 18, digital data paths such as UART paths, etc. The digital data lines that are available in connector arrangements of the type shown in FIG. 6 may be used to support advanced functions for adapter accessory 18 such as functions related to updating firmware in adapter accessory 18 by uploading new firmware from device 10, functions related to implementing security features (e.g., functions in which authorization codes are used by device 10 and adapter accessory 18), etc.

Figure 7:
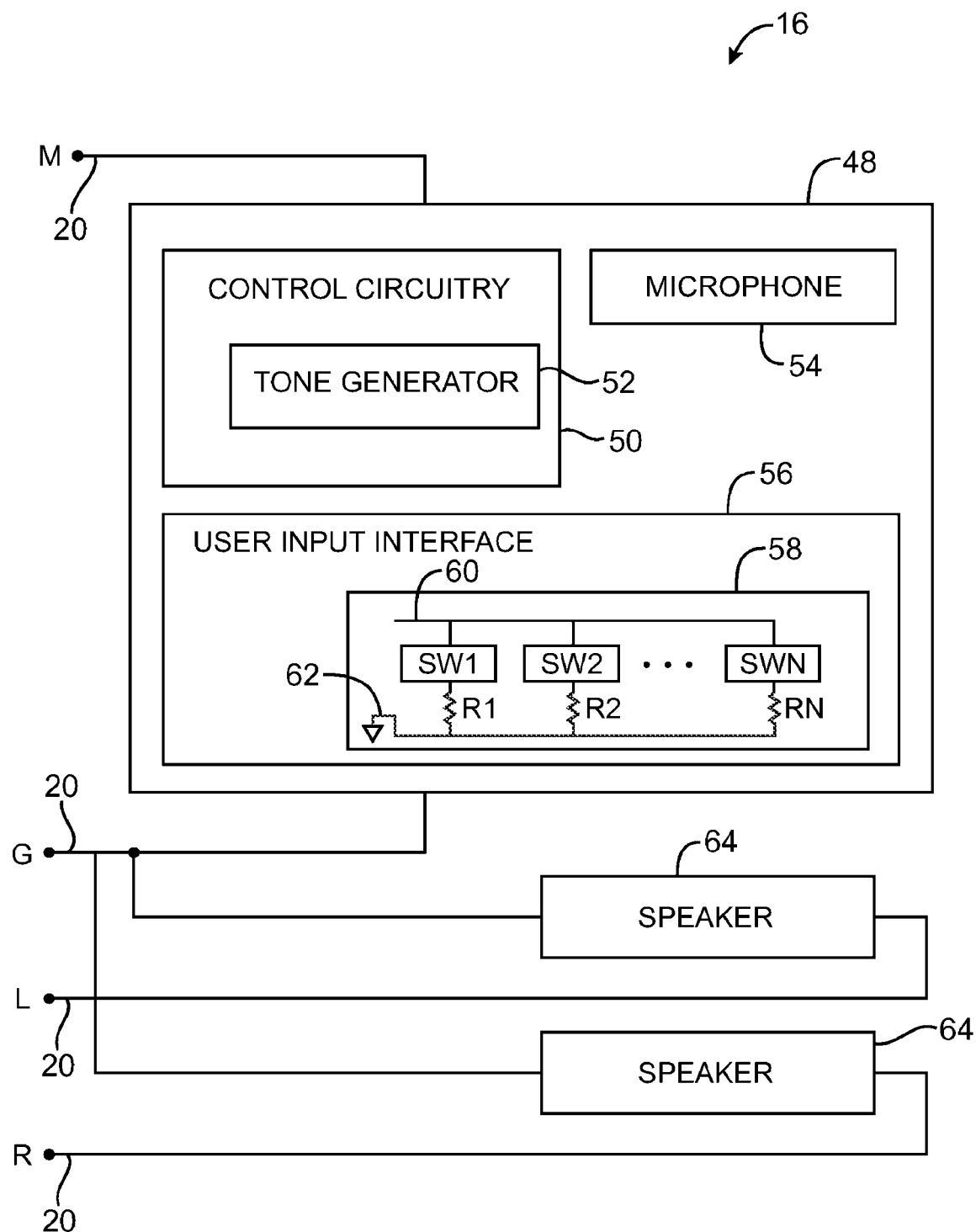
FIG. 7 is a diagram of an illustrative accessory in accordance with an embodiment of the present invention.

An illustrative accessory 16 is shown in FIG. 7. As shown in FIG. 7, accessory 16 may have one or more speakers 64. Speakers 64 may be connected between ground line G in path 20 and right and left lines R and L in path 20, respectively. Accessory 16 may have a microphone such as microphone 54. In a typical arrangement, a user may use microphone 54 and other circuitry 48 during cellular telephone voice calls or when making audio recordings. Speakers 64 may be used during media playback operations or during voice telephone calls.

Accessory 16 may have a user input interface such as user input interface 56. User input interface 56 may include buttons, a touch pad, a touch screen, or any other suitable components for receiving user input from a user of accessory 16. In the example of FIG. 7, user input interface 56 includes a plurality of resistively encoded buttons. With this type of arrangement, a user may press a given button, thereby actuating an associated one of switches SW1, SW2, . . . SWN. When a given switch is closed, an associated resistance R1, R2 . . . RN is imposed across lines 60 and 62. These lines may be connected to impedance detector circuitry in control circuitry 50 (and, if desired, may be selectively connected across microphone terminal M and ground terminal G). The impedance detector circuitry can determine which button has been pressed by the user by examining the resistance across lines 60 and 62. Control circuitry 50 may also be used to monitor the timing of user button presses. This may allow control circuitry 50 to discriminate a click and hold operation from a double click, etc. (If desired, timing discrimination operations may be performed elsewhere in the system such as in adapter accessory 18 or device 10 in addition to or in place of performing these operations in control circuitry 50.)

After determining what user input has been provided by the user to accessory 16, control circuitry 50 may transmit the user input to adapter accessory 18 via path 20. Any suitable communications format may be used to convey user input information from accessory 16 to adapter accessory 18. For example, control circuitry 50 may include analog communications circuitry and/or digital communications circuitry that communicates with corresponding analog and/or digital communications circuitry in adapter accessory 18. In turn, adapter accessory 18 may have analog and/or digital communications circuitry that communicates with analog and/or digital communications circuitry in device 10. If desired, the data communications links that are formed between accessories 16 and adapter accessory 18 and that are formed between adapter accessory 18 and device 10 may support high speed parallel or serial communications. More modest data throughput requirements may be satisfied using relatively low speed links.

With one illustrative arrangement, control circuitry 50 may include a tone generator such as tone generator 52. Tone generator 52 may generate ultrasonic tones (e.g., sinusoidal tones, saw wave signals, or other suitable periodic signals) on path 20 (e.g., across the microphone terminal M and ground terminal G). Ultrasonic tones have frequencies greater than the normal upper limit of human hearing (e.g., over 20 kHz), so ultrasonic tones will not interfere with normal audio operations (e.g., normal microphone signals on the microphone line). Accordingly, a user may provide user input such as button press input while simultaneously providing microphone signals across the microphone and ground terminals using microphone 54 (e.g., during a voice call or audio recording).

The ultrasonic tones that are provided by tone generator 52 may be coded using any suitable scheme. For example, each unique ultrasonic tone or unique pattern of two or more tones may correspond to a different user input command. If desired, handshaking and calibration tones may be provided to enhance the robustness of the system.

Figure 8:
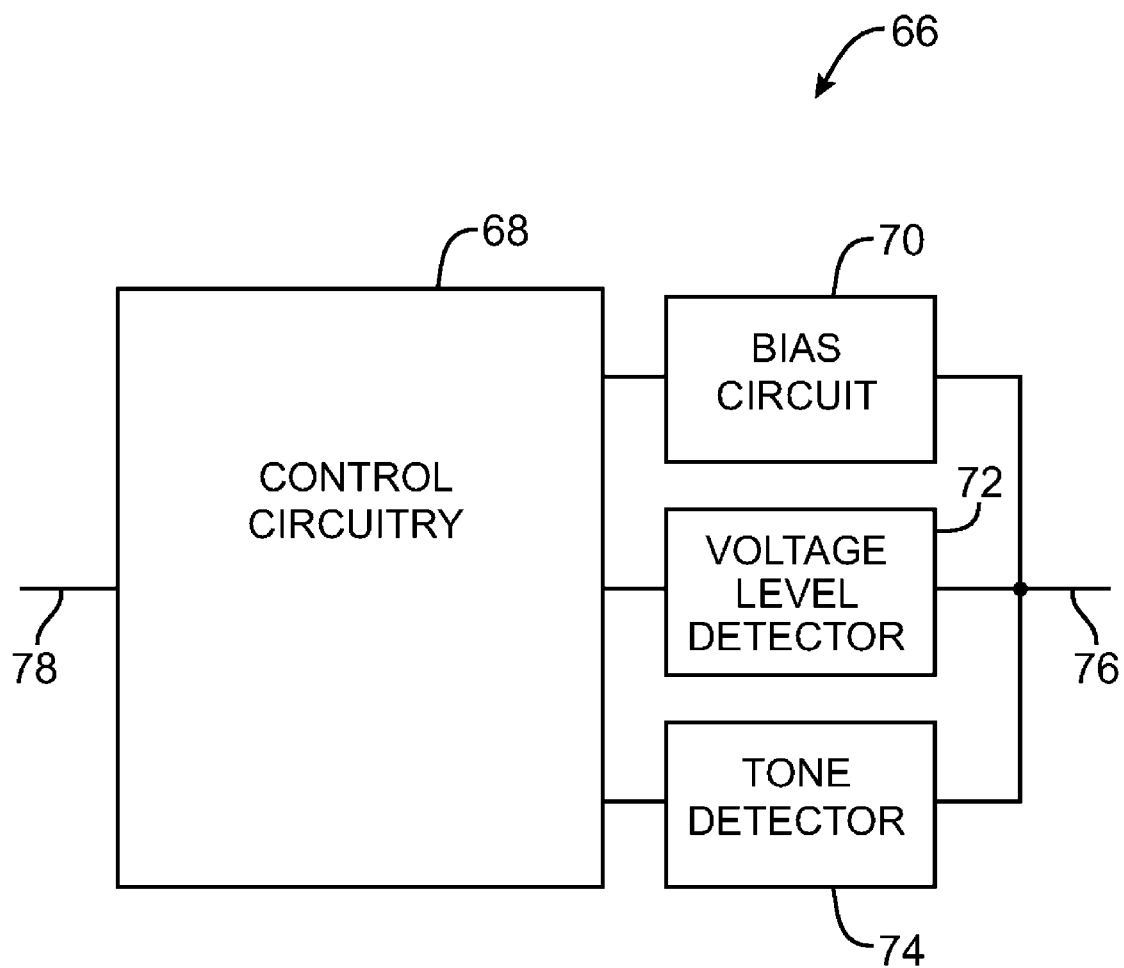
FIG. 8 is a diagram of illustrative circuitry that may be used in an electronic device or in an adapter to interface with a headset or other accessory in accordance with an embodiment of the present invention.

The ultrasonic tones or other user input signals may be received using receiver circuitry such as receiver circuitry 66 of FIG. 8. Receiver circuitry 66 may include an input path such as input 76 and an output path such as output 78. In a typical arrangement, the microphone line M and ground line G associated with an audio jack may be used to receive user input data. With this type of arrangement, input 76 may be connected to a microphone terminal M in an audio jack (e.g., in device 10 or in adapter accessory 18).

Receiver circuitry 66 may include tone detector circuitry 74 for receiving ultrasonic tones transmitted from tone generator 52 of FIG. 7. Tone detector 74 may provide corresponding detected user input data to control circuitry 68. In configurations in which it is desired to forward the user input data (e.g., when circuitry 66 is implemented in an adapter accessory 18 and is being used to pass the user input data to device 10), control circuitry 68 may supply the received user input data on output 78. The version of the user input that is provided on output 78 may be in a different format than the version of the user input data that is received on path 76. For example, tone detector 74 may receive user input in the form of unprocessed ultrasonic tone signals, whereas control circuitry 68 may provide processed versions of the same user input signals on output 78 in the form of digital data. In some configurations, control circuitry 68 may produce local control signals in response to received user input.

If desired, receiver circuitry 66 may include additional circuit components such as bias circuit 70 and voltage level detector 72. Bias circuit 70 may be connected to microphone terminal M in an audio jack and may be used to supply a microphone bias to an accessory microphone such as microphone 54 of FIG. 7. An optional voltage level detector 72 may be used to detect momentary shorts between microphone terminal M and ground G that arise in configurations in which accessory 16 is provided with a shorting button connected across the M and G terminals. Voltage level detector 72 may also be used to monitor resistively encoded buttons that are connected across the M and G terminals to determine which buttons have been pressed.

Multiple circuits such as circuit 66 of FIG. 8 may be used in adapter accessory 18 to interface with multiple corresponding accessories 16. For example, in an adapter accessory that is configured to allow a device to be shared by two users, the adapter may include two receiver circuits 66, each of which is used to handle user input from a respective one of the accessories. An electronic device that contains only a single audio jack may have only a single corresponding receiver circuit 66.

Figure 9:
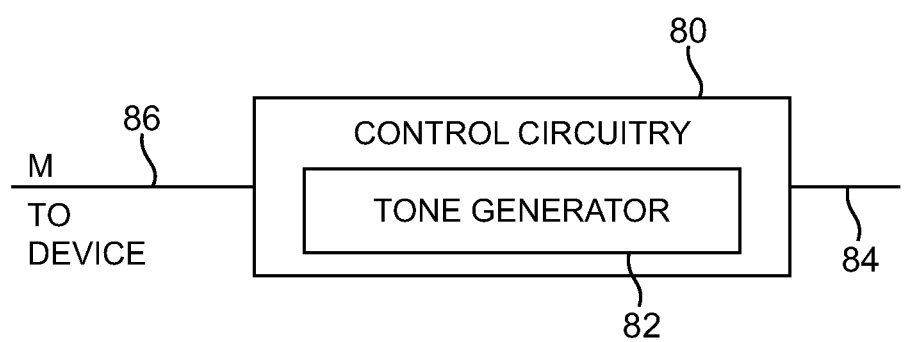
FIG. 9 is a diagram of illustrative circuitry that may be used to communicate with circuitry of the type shown in FIG. 8 in accordance with an embodiment of the present invention.

In configurations in which adapter accessory 18 is connected to device 10 using an audio jack, it may be desirable to provide adapter accessory 18 with communications circuitry similar to that of an accessory 16. As an example, device 10 may be provided with receiver circuitry such as ultrasonic tone detector 74 of FIG. 8. Adapter accessory 18 may be provided with control circuitry such as control circuitry 80 of FIG. 9 that includes a corresponding ultrasonic tone generator such as tone generator 82. Control circuitry 80 may receive input from processing circuitry in adapter accessory 18 via input path 84 and may transmit corresponding ultrasonic tones to device 10 via path 86 (e.g., the microphone line M in a path 20 between adapter accessory 18 and device 10).

Figure 10:
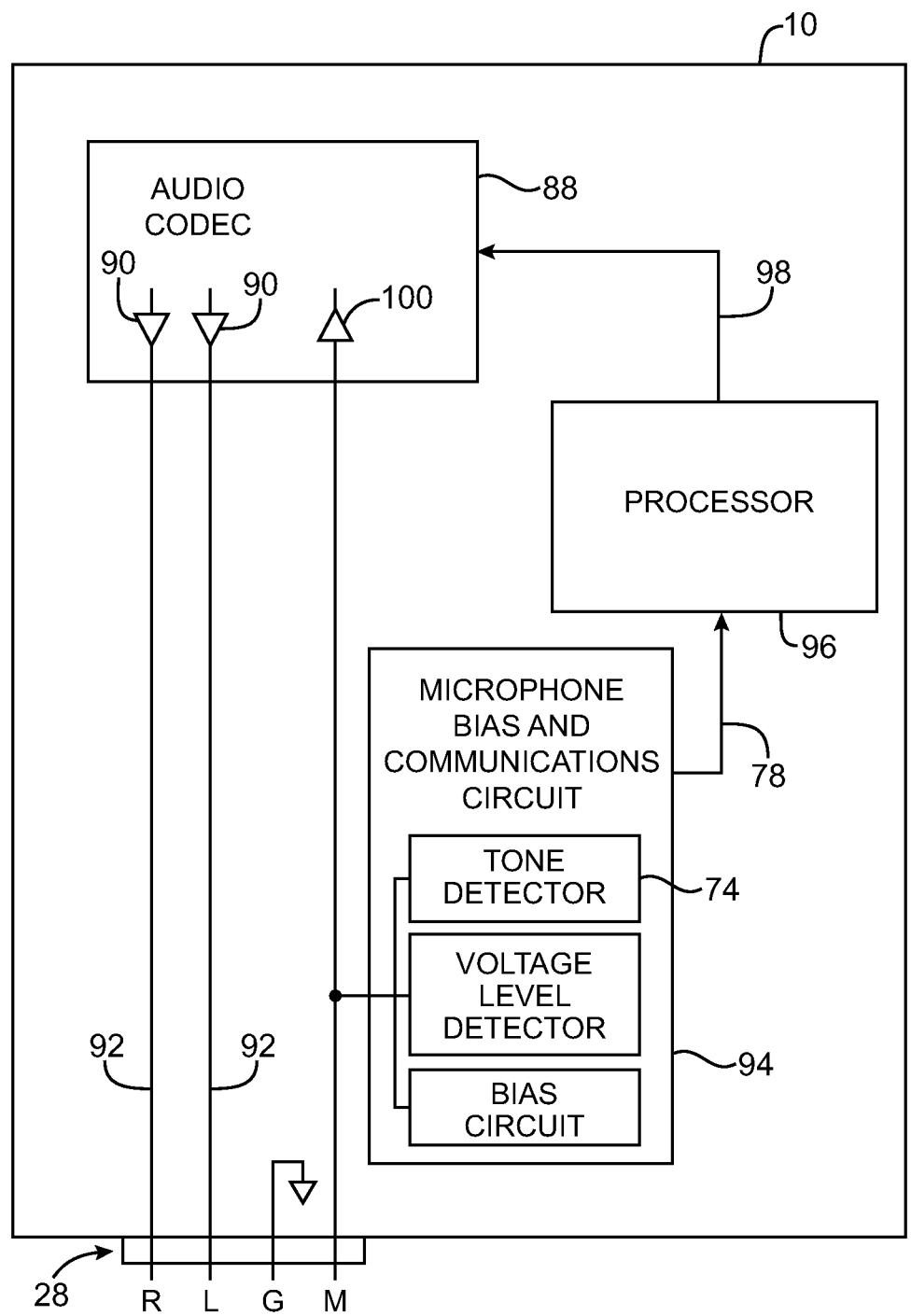
FIG. 10 is a diagram of an illustrative electronic device having an audio jack that may mate with an adapter accessory in accordance with an embodiment of the present invention.

An illustrative arrangement for device 10 in configurations in which adapter accessory 18 is connected to device 10 using an audio jack is shown in FIG. 10. In the example of FIG. 10, device 10 has an audio circuit such as audio codec circuit 88. Audio circuit 88 may include a digital-to-analog converter that drives analog signals through audio amplifiers 90. Lines 92 may be used to supply these amplified audio signals to the R and L contacts in audio jack 28. The audio signals may correspond to amplified music or voice telephone content (as examples).

Microphone line M may be connected to an input amplifier 100 to receive microphone signals from accessories 16 and adapter accessory 18. Microphone bias and communications circuit 94 may use components of the type described in connection with FIG. 8 to bias microphone line M and to receive user input from adapter accessory 18. The output of circuitry 94 on line 78 may be routed to storage and processing circuitry such as processor 96. Processor 96 may process the received user input to determine what action is required (e.g., a media playback adjustment, a volume adjustment, etc.). As illustrated by path 98, processed output signals from processor 96 may be provided to audio circuit 88 (e.g., to control the gain of amplifiers 90, etc.).

Figure 11:
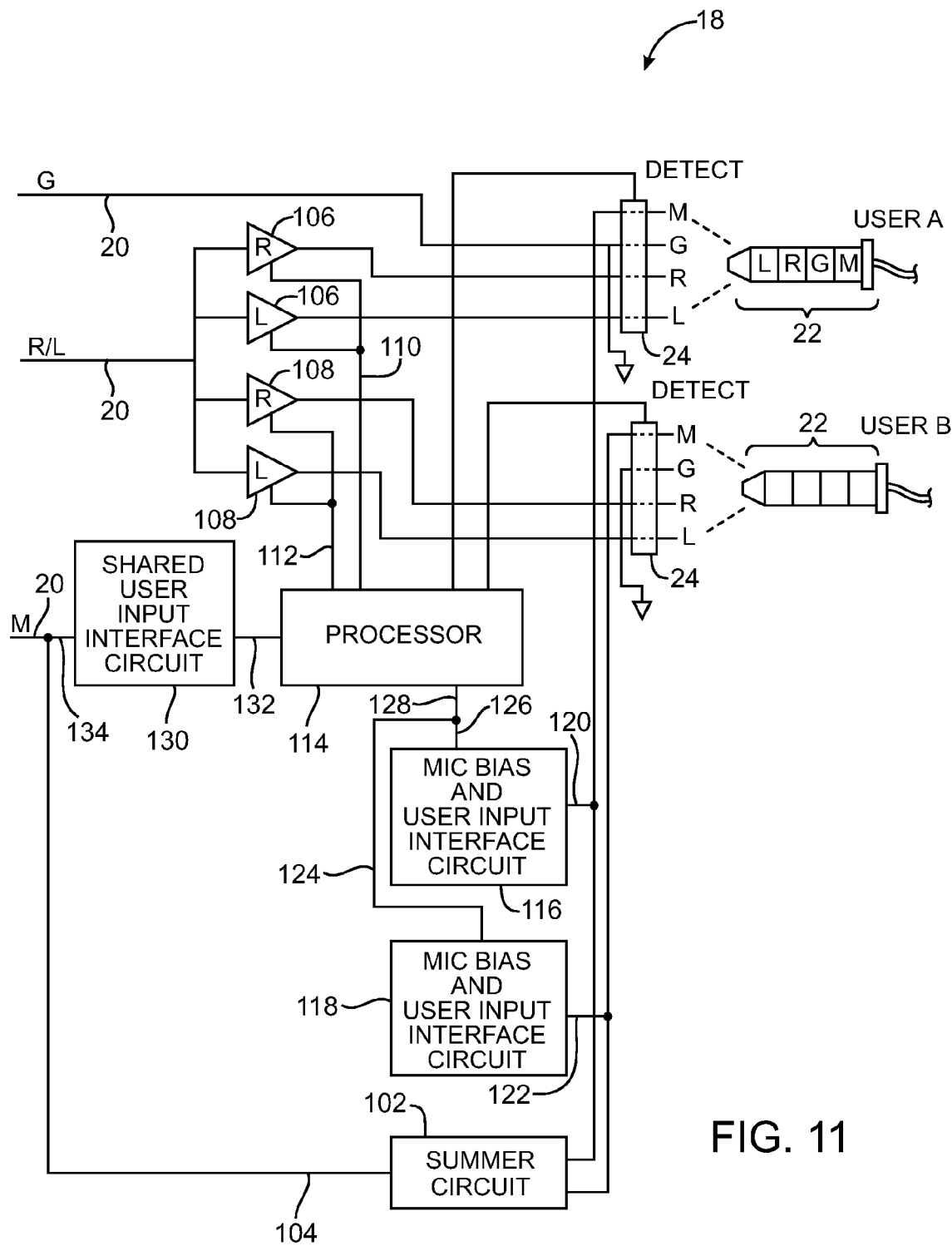
FIG. 11 is a diagram of an illustrative adapter accessory that may mate with an electronic device of the type shown in FIG. 10 in accordance with an embodiment of the present invention.

FIG. 11 shows illustrative circuitry that may be used in an adapter accessory 18 that is connected to a device such as device 10 of FIG. 10. Output lines in path 20 may be connected to respective contacts in a four-contact plug such as plug 42 of FIG. 5 or plug 42 of FIG. 4. The circuitry of adapter accessory 18 of FIG. 11 may be powered using a battery or using a device power tapping arrangement of the type described in connection with FIG. 4.

Audio jacks 24 may receive mating audio plugs 22 from multiple accessories 16. Manual switches may change their state (shown as the DETECT signal in FIG. 11) as each audio plug 22 is inserted in a jack 24. The microphone lines M from jacks 24 may be routed to the input of summing circuit 102. A corresponding summed microphone signal may be conveyed to microphone terminal M in path 20 via output line 104. With this type of arrangement, users of accessories 16 can communicate with each other during use of device 10. For example, during movie playback users may converse with each other by speaking into their respective microphones. The combined microphone signals from the microphones may be received by device 10 and played back for the users through electronic device audio amplifiers 90 and adapter accessory audio amplifiers 106 and 108.

Amplifier circuitry 106 may include amplifiers for right and left stereo audio channels for a first user (e.g., user A), whereas amplifier circuitry 108 may include amplifiers for right and left stereo audio channels for a second user (e.g., user B). Control path 110 may be used to adjust the gain of amplifier circuitry 106 for user A. Control path 112 may be used to make local gain adjustments to the gain of amplifier circuitry 108 for user B.

Control circuitry such as processor 114 may be used to generate control signals for amplifier circuitry 106 and 108. User input from the accessory associated with user A may be received by microphone bias and user input interface circuit 116 using microphone line 120. Microphone line path 122 may be used to route user input signals from the accessory associated with user B to microphone bias and user input interface circuit 118. Circuits 116 and 118 may be circuits of the type shown in FIG. 8 that supply microphone bias to microphones in the accessories of users A and B and that monitor the microphone lines M of these accessories to detect user input.

Received user input may be conveyed from circuit 116 to processor 114 using path 126 and path 128. Received user input may be conveyed from circuit 118 to processor 114 using path 124 and path 128. Paths 124 and 126 may be connected to a common path 128 (e.g., when path 128 is a two-wire serial bus connected to a single two-wire serial bus port in processor 114) or separate paths may be used to convey user input data from receiver circuits 116 and 118 to processor 114 (e.g., when separate two-wire serial bus ports are available in processor 114).

Shared user input interface circuit 130 may be connected to processor 114 via path 132 and may be connected to microphone line M in path 20 via path 134. Circuit 130 may include circuitry such as control circuitry 80 and tone generator 82 of FIG. 9. Using this type of arrangement, circuit 130 can receive data (e.g., user input) from processor 114 that processor 114 has received from user A or user B (e.g., using receiver circuits 116 and 118). This received user input data can then be conveyed to device 10 by transmitting the user input data as ultrasonic tones using tone generator 82. In device 10, tone detector 74 of circuitry 94 (FIG. 10) may receive the ultrasonic tones. Processing circuitry such as processor 96 of FIG. 10 may be used in determining which actions should be taken in response to the received user input. For example, if the user input is a stop command (received from either user A or user B), device 10 may stop media playback.

As another example, if the user input corresponds to a requested volume increase for user A and all or some of that volume increase was not accommodated by adjustments to the gain of amplifier circuitry 106 of FIG. 11, device 10 may increase the output of audio amplifiers 90. At the same time, processor 114 may make compensating gain reductions for the gain of amplifier circuitry 108 to ensure that the volume for the played back audio signals for user B are not affected by user A's volume increase request.

The arrangement of FIG. 11 therefore allows multiple users with multiple corresponding accessories 16 to communicate with a single adapter accessory 18. The single adapter accessory 18 may include individually adjustable circuitry for each user such as individually adjustable amplifier circuits 106 and 108. Accordingly, the adapter accessory 18 may be able to make some user-specific adjustments locally, without involving device 10. Globally applicable user input commands, such as commands to stop the playback of a movie on device 10, may be routed to device 10 using processor 114 and shared user input interface circuit 130. If desired, processor 114 may determine how to optimally adjust local amplifiers such as amplifiers 106 and 108 and device amplifiers 90 so as to ensue that the audio played back to the users through speakers 64 in accessories 16 is not too weak or distorted due to unbalanced gain adjustments.

Figure 12:
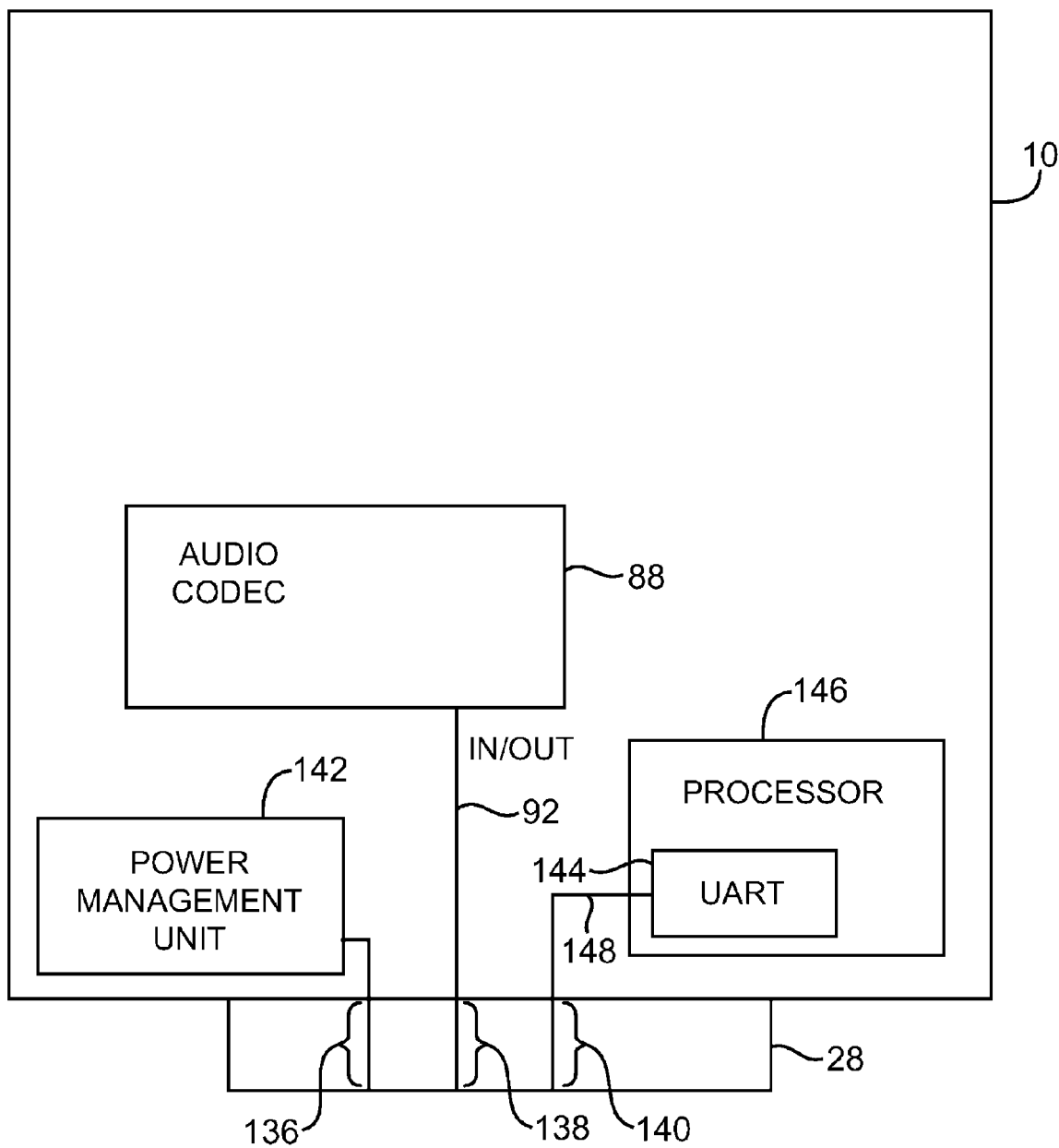
FIG. 12 is a diagram of an illustrative electronic device having a data port connector that may mate with an adapter accessory in accordance with an embodiment of the present invention.

FIG. 12 shows an illustrative arrangement that may be used for electronic device 10 to accommodate adapter accessories 18 that have data connectors such as data connector 26 of FIG. 6. As shown in FIG. 12, device 10 may have a connector 28 that includes lines such as lines 136, 138, and 140. Connector 28 may be, for example, a 30-pin connector. Lines 136 may be power lines that are used in supplying adapter accessory 18 with power from a battery or other power source in device 10 using power management unit 142. Lines 138 may include line in and line out lines (for both left and right audio channels). The output lines in lines 138 may be used to provide amplified stereo audio to the adapter accessory. The input lines in lines 138 may be used to handle first and second microphone input signals (e.g., from user A and user B, respectively). Lines 140 may be connected to a communications circuit such as UART circuit 144 in storage and processing circuitry such as processor 146 via path 148. Using UART 144, device 10 can communicate with a corresponding communications circuit in the adapter accessory. UART 144 or other communications circuitry may be used to support synchronous or asynchronous data communications, may support serial or parallel communications, may support communications using digital data or analog signals, or may support any other suitable control scheme.

Figure 13:
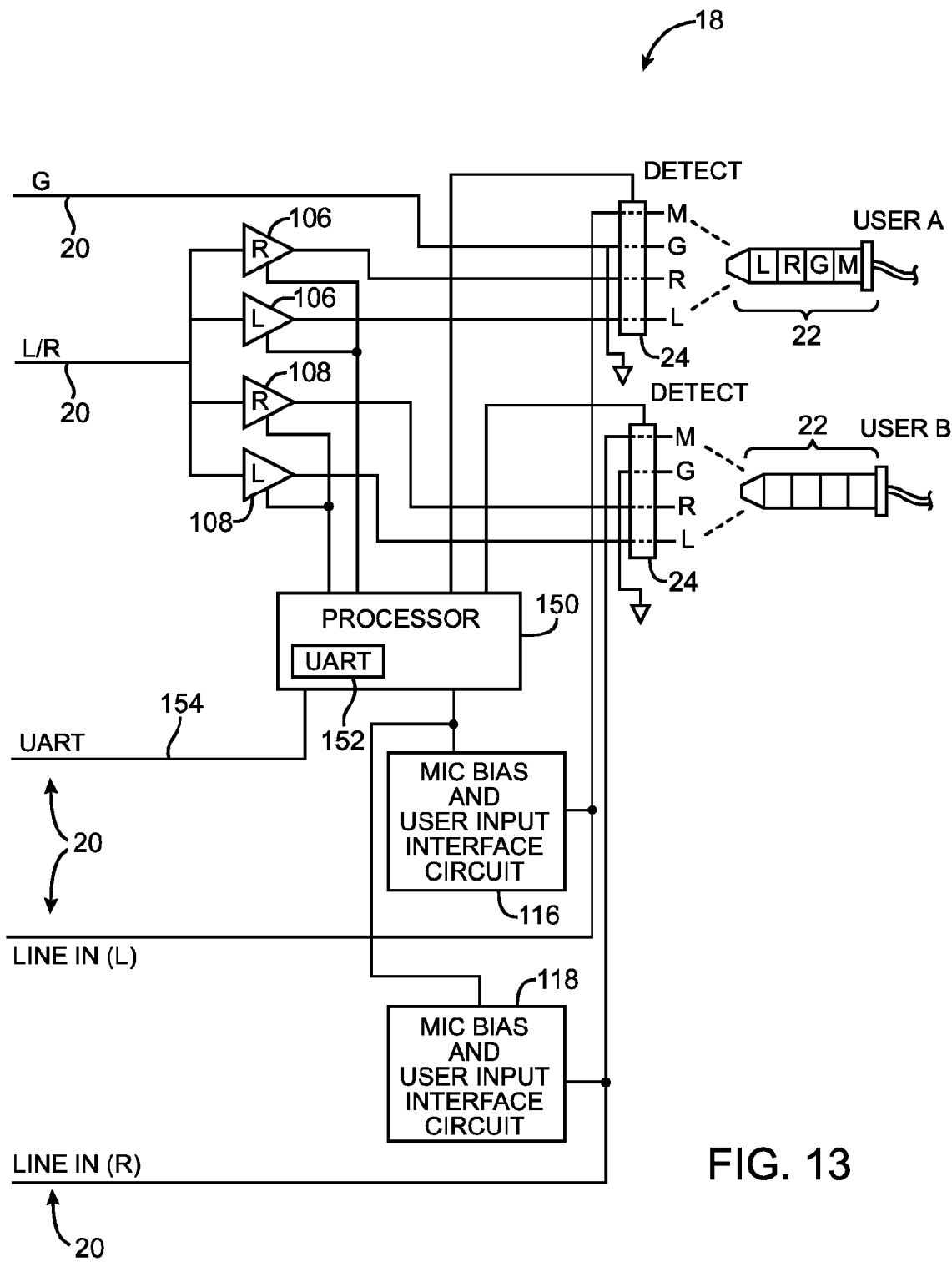
FIG. 13 is a diagram of an illustrative adapter accessory that may mate with an electronic device of the type shown in FIG. 12 in accordance with an embodiment of the present invention.

An illustrative adapter accessory 18 that may be used in conjunction with device 10 of FIG. 12 is shown in FIG. 13. As shown in FIG. 13, adapter accessory 18 may include storage and processing circuitry such as processor 150. Processor 150 may include a UART circuit or other suitable communications circuitry such as UART 152. UART 152 may be coupled to UART communications path 154. When adapter accessory 18 is connected to device 10 of FIG. 12, path 154 may be electrically connected to lines 140 and path 148, so that UART 152 of the adapter accessory can communicate with UART 144 of device 10. This communications path may be used to support authentication of adapter accessories (e.g., using an authentication code stored in processor 150 and a corresponding code stored in processor 146 of FIG. 12), firmware updates (e.g., by using processor 146 to upload updated firmware to processor 150 of FIG. 13), or other suitable functions.

Accessories 16 may be connected to adapter accessory 18 of FIG. 13 using jacks 24 and plugs 22. Adapter accessory 18 may use microphone bias and user input interface circuit 116 to receive user input from user A and may use microphone bias and user input interface circuit 118 to receive user input from user B. Received user input from circuits 116 and 118 may be provided to processor 150. As with processor 114 of adapter accessory 18 of FIG. 11, processor 150 of adapter accessory 18 of FIG. 13 may supply control commands that independently adjust the gain of amplifier circuitry 106 for user A and that adjust the gain of amplifier circuitry 108 for user B. Audio input for amplifier circuitry 106 and 108 may be obtained from the line out lines in lines 138 of connector 28 (FIG. 12).

The "line in" lines among lines 138 of connector 28 (FIG. 12) may be connected to the line in (L) and line in (R) lines in path 20 of FIG. 13. These lines need not be associated with left and right stereo signals, but rather may be associated with microphone signals from the microphone lines M of user A and user B, respectively. With this type of arrangement, adapter accessory 18 may be used to forward microphone signals from each user to device 10. Device 10 can mix the signals, can selectively mute the incoming microphone signals, and can perform other suitable audio processing on the microphone signals. If desired, users can communicate with each other (e.g., during movie playback).

To enhance audio quality, a noise gating scheme may be used. With this type of arrangement, microphone signals are only processed and returned to the users when the level of the incoming microphone signals exceeds a predefined noise threshold.

The foregoing is merely illustrative of the principles of this invention and various modifications can be made by those skilled in the art without departing from the scope and spirit of the invention.

What is claimed is:

1. A method of operating an adapter comprising a first audio circuit and a second audio circuit independent of the first audio circuit, the adapter configured for connecting an electronic device, a first accessory, and a second accessory, the method comprising:

at the adapter, receiving a first command signal from the first accessory and receiving a second command signal from the second accessory;

at the adapter, generating control signals, with a control circuitry, by processing the first and the second command signals, wherein a first control signal, associated with the first command signal, is used to modify a gain value of the first audio circuit, a second control signal, associated with the second command signal, is used to modify a gain value of the second audio circuit independent of the first audio circuit, and a third control signal is used to modify an operation of the electronic device;

sending the first control signal to the first audio circuit and the second control signal to the second audio circuit;

sending the third control signal to the electronic device; and at the adapter, adjusting, with the control circuitry, the gain values of the first and second audio circuits in accordance with the first and second control signals, respectively.

2. The method defined in claim 1, wherein the third control signal modifies video playback on the electronic device.

3. The method defined in claim 1, wherein the third control signal adjusts the gain of an audio circuitry on the electronic device.

4. The method defined in claim 3, wherein in response to the first command signal, the control circuitry regulates each of the first, second, and third control signals in order to adjust the first audio circuit, the second audio circuit, and the audio circuitry on the electronic device, respectively.

5. The method defined in claim 1, wherein the third control signal is relayed to the electronic device over a microphone line.

6. The method defined in claim 1, wherein the third control signal is relayed to the electronic device via ultrasonic tones.

7. The method defined in claim 1, further comprising:
at the adapter, receiving a first and a second microphone audio signal;
summing the first and the second microphone audio signals to generate a summed microphone audio signal; and
relaying the summed microphone audio signal to the electronic device.

8. The method defined in claim 7, further comprising:
at the electronic device, performing audio processing on the summed microphone signal to generate a processed microphone audio signal;
sending the processed microphone audio signal to the adapter; and
at the adapter, relaying the processed microphone audio signal to at least one user.

9. The method defined in claim 1, further comprising:
transmitting at least some of the received command signals and the microphone audio signals to the electronic device from the adapter using an Universal Asynchronous Receiver-Transmitter (UART).

10. The method defined in claim 9, further comprising:
receiving data from the electronic device at the adapter using the UART.

11. The method defined in claim 10, wherein receiving the data comprises receiving a firmware update for the adapter.

12. An adapter for connecting an electronic device to a first accessory and to a second accessory, comprising:
a first and a second audio connector, each audio connector configured to couple to a user headset, wherein each headset generates a command signal over an input microphone line;
a device connector configured to connect the adapter to the electronic device;
a first and a second audio amplifier configured to receive audio signals from the electronic device and to amplify the audio signals routed to the first and second audio connectors, respectively; and
a control circuitry configured to receive the command signals from the input microphone lines and to generate a first, a second, and a third control signal in response to the command signals, wherein the first and the second control signal correspond to individualized volume controls and are configured to control the gain of the first and second audio amplifiers respectively, and wherein the third control signal corresponds to functionality available on the electronic device and is routed to the electronic device via the device connector.

13. The adapter of claim 12, further comprising:
a tone detector circuit configured to detect ultrasonic signals over an input microphone line.

14. The adapter of claim 12, further comprising:
a voltage level detector circuit configured to detect a voltage drop between an input microphone line and ground.

15. The adapter of claim 12, further comprising:
a biasing circuit configured to supply a microphone bias to an accessory microphone.

16. The adapter of claim 12, wherein the device connector is an audio jack comprising a jack for an output microphone line.

17. The adapter of claim 16, further comprising:
a summing circuit configured to receive a first and a second microphone signal over a first and a second input microphone line respectively, and to generate a summed microphone signal that is routed to the electronic device via the output microphone line on the device connector.

18. The adapter of claim 16, further comprising:
a user output circuitry configured to receive the first control signal and to generate ultrasonic tones in response to the first control signal wherein the ultrasonic tones are routed to the electronic device via the output microphone line.

19. The adapter of claim 12, wherein the device connector is a 30 pin connector.

20. The adapter of claim 19, wherein the control circuitry further comprises a circuitry to support Universal Asynchronous Receiver-Transmitter (UART) communication with the electronic device.

21. The adapter of claim 19, further comprising a connector having power lines that tap power for the adapter from the electronic device.

22. The adapter of claim 12, further comprising a battery that powers the adapter.

* * * * *